United States Patent
Rynne

Patent Number: 6,011,297
Date of Patent: *Jan. 4, 2000

[54] USE OF MULTIPLE SLOTS SURROUNDING BASE REGION OF A BIPOLAR JUNCTION TRANSISTOR TO INCREASE CUMULATIVE BREAKDOWN VOLTAGE

[75] Inventor: D. Michael Rynne, Saratoga, Calif.

[73] Assignee: Advanced Micro Devices, Inc., Sunnyvale, Calif.

[*] Notice: This patent is subject to a terminal disclaimer.

[21] Appl. No.: 08/897,167

[22] Filed: Jul. 18, 1997

[51] Int. Cl.$^7$ ................................. H01L 29/732
[52] U.S. Cl. .................. 257/526; 257/511; 257/592; 257/517; 257/508
[58] Field of Search .................. 257/592, 506, 257/511, 526

[56] References Cited

U.S. PATENT DOCUMENTS

| | | | |
|---|---|---|---|
| 4,292,642 | 9/1981 | Appels et al. | 357/13 |
| 4,409,606 | 10/1983 | Wagenaar et al. | 357/13 |
| 4,533,430 | 8/1985 | Bower | 156/643 |
| 4,534,824 | 8/1985 | Chen | 156/628 |
| 4,579,812 | 4/1986 | Bower | 430/313 |
| 4,621,414 | 11/1986 | Iranmanesh | 29/576 W |
| 4,626,317 | 12/1986 | Bonn | 156/643 |
| 4,733,287 | 3/1988 | Bower | 357/34 |
| 4,745,087 | 5/1988 | Iranmanesh | 437/69 |
| 4,749,661 | 6/1988 | Bower | 437/33 |
| 4,771,418 | 9/1988 | Narasimhan et al. | 370/58 |
| 4,795,721 | 1/1989 | Bower et al. | 437/67 |
| 4,803,176 | 2/1989 | Bower | 437/33 |
| 4,860,082 | 8/1989 | Moriyama et al. | 357/49 |
| 4,933,733 | 6/1990 | Iranmanesh et al. | 357/72 |
| 5,208,169 | 5/1993 | Shah et al. | 437/31 |
| 5,268,312 | 12/1993 | Reuss et al. | 437/30 |
| 5,294,825 | 3/1994 | Nakagawa et al. | 257/487 |
| 5,386,140 | 1/1995 | Matthews | 257/592 |
| 5,496,746 | 3/1996 | Matthews | 437/31 |
| 5,554,872 | 9/1996 | Baba et al. | 257/342 |
| 5,661,329 | 8/1997 | Hiramoto et al. | 257/510 |
| 5,859,469 | 1/1999 | Rynne | 257/592 |
| 5,912,501 | 6/1999 | Rynne et al. | 257/508 |

*Primary Examiner*—David B. Hardy
*Attorney, Agent, or Firm*—H. Donald Nelson

[57] ABSTRACT

A semiconductor device having the base region surrounded by at least two continuous slots. The collector region is surrounded by at least one continuous slot formed as a continuation of one of the at least two continuous slots surrounding the base region. The portions of the slots that are over the buried layer extends beyond the surface of the buried layer and the portions of the slots not over the buried layer extends beyond the interface between the epitaxial layer and the substrate. The slots are filled with either polysilicon or tungsten. The base region terminates on the surface of the innermost slot surrounding the base region. The boundary of the base region terminates substantially perpendicular to the surface of the surrounding slot.

11 Claims, 7 Drawing Sheets

USE OF MULTIPLE SLOTS SURROUNDING BASE REGION OF A BIPOLAR JUNCTION TRANSISTOR TO INCREASE CUMULATIVE BREAKDOWN VOLTAGE

CROSS REFERENCE TO RELATED APPLICATIONS

This application is related to Application, Ser. No. 08/897,165, filed on the filing date of this application, entitled REDUCTION OF DEPLETION SPREADING SIDEWAYS UTILIZING SLOTS, Application, Ser. No. 08/897,166, filed on the filing date of this application, entitled USE OF TUNGSTEN FILLED SLOTS AS GROUND PLANE IN INTEGRATED CIRCUIT MANUFACTURE AND ALSO FOR LOW RESISTANCE CONTACT, Application, Ser. No. 08/897,265, filed on the filing date of this application, entitled ELIMINATION OF RADIUS OF CURVATURE EFFECTS ON P-N JUNCTION AVALANCHE BREAKDOWN USING SLOTS and Application, Ser. No. 08/897,082, filed on the filing date of this application, entitled USE OF SLOTS IN DEEP ISOLATION AND COLLECTOR PICKUP REGIONS FOR MINIMIZATION OF SUB-COLLECTOR UP-DIFFUSION.

BACKGROUND OF THE INVENTION

1. Field of the Invention

This invention relates generally to high voltage semiconductor devices. More particularly, this invention relates to high voltage bipolar semiconductor devices in which the base region is surrounded by at least two slots and the collector region is surrounded by at least one slot. The slots are filled with either polysilicon or tungsten. The slots extend beyond the surface of the buried layer or beyond the interface between the epitaxial layer and the substrate.

2. Discussion of the Related Art

The bipolar transistor is an electronic device with two pn junctions in very close proximity. There are three device regions: an emitter region, a base region, and a collector region. The two pn-junctions are known as the emitter-base (EB) junction and the collector-base (CB) junction. Modulation of the current in one pn-junction by means of a change in the bias of the other nearby pn-junction is called bipolar-transistor action. Because the mobility of minority carriers (electrons) in the base region of npn transistors is higher than that of holes in the base of pnp transistors, higher frequency operation and higher speed performances can be obtained with npn devices. For this reason, the following discussion will be in terms of npn transistors but it is to be understood that the discussion is applicable to pnp transistors as well.

The desired device characteristics of bipolar transistors include: high current gain, high frequency ac operation, fast switching speed, high device-breakdown voltages, minimum device size (to achieve high functional density) and high reliability of device operation. In order for high-frequency ac performance and fast switching speed to be achieved, the parasitic resistances of the transistor; $R_E$, $R_B$, and $R_C$, and the parasitic junction capacitances; $C_{EB}$, $C_{CB}$, and $C_{CB}$ must be minimized. In addition, high-level injection effects, for example, the Kirk effect should be avoided. For faithful amplification of ac signals, the Early voltage must be high.

To achieve the higher performance required by end users of semiconductor devices, such as computer users or telephony equipment users, it is necessary for the semiconductor manufacturers to provide faster and smaller integrated circuits. There is particular concern for the users of analog devices that typically have a high operating voltage and a requirement for high frequency operation. In order for a semiconductor device to operate at a high voltage and at a high frequency, the doping concentrations of the various pn-junctions must be carefully controlled to provide depletion regions so that the device has the necessary breakdown voltage. As is known in the semiconductor art, there is a tradeoff between high operating voltages and high frequency operation. For example, to obtain a high breakdown voltage, the doping concentrations on each side of a pn-junction should be low, however, a low doping concentration increases the resistance of the device and will decrease the operating frequency. Because the device breakdown voltage is designed to be determined by the base-collector junction because the doping concentrations are lower at the base-collector pn-junction. Therefore, it is necessary to ensure that the device does not breakdown in the sideways direction from the vertical boundaries of the base region to the adjacent structures, which could be either the collector or an isolation structure.

Therefore, what is needed, is a semiconductor device that has a high operating voltage, a high operating frequency and that can be shrunk.

SUMMARY OF THE INVENTION

The present invention is directed to a semiconductor device having a base region surrounded by at least two slots.

The base region and the slots are formed in an epitaxial region of the semiconductor device. The semiconductor device has a buried layer formed on a portion of the interface between the epitaxial layer and the substrate.

The semiconductor device has a collector region surrounded by at least one slot that is an extension of one of the slots surrounding the base region. The portions of the slots over the buried layer extend beyond the surface of the buried layer and the portions of the slots not over the buried layer extend beyond the interface between the epitaxial region and the substrate.

The base region of the semiconductor device terminates on the surface of the innermost slot surrounding the base region. The boundary of the base region terminates substantially perpendicular to the surface of the innermost slot. The slots are filled with a material such as polysilicon or tungsten.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention that illustrates the best mode presently contemplated by the inventor for practicing the invention and which is set forth in the accompanying drawings. The drawings referred to in this description are diagrammatic and, for clarity, are not drawn to scale. The drawings illustrate only one portion of an integrated circuit fabricated in accordance with the present invention. For each of the descriptions provided below, a typical manufacturing process is given for each step. It should be appreciated that other manufacturing processes could be used and other manufacturing processes would become apparent to a person skilled in the art and, therefore, the recitation of a particular manufacturing process should not be construed to be limiting. It is noted that in some instances conventions such as p− and n+ are given by way of example, in which case the concentrations are not critical to the implementation of the present invention. The corresponding dopant types and concentrations would be apparent to a person skilled in the relevant art. For those instances in which the concentration is critical to the implementation of the present invention, the value of the concentration is specified.

FIGS. 1–4 show selected initial steps in the manufacture of a standard-buried-collector (SBC) npn semiconductor device. The selection of an SBC npn semiconductor device is for convenience only and is not meant to restrict the invention only to SBC npn semiconductor devices as the concepts of the present invention are applicable to other types of semiconductor devices. FIGS. 5–8 show selected continuing steps in the manufacture of the semiconductor device shown in FIGS. 1–4 in which a semiconductor device as known in the prior art is formed. FIGS. 9–13 show selected continuing steps in the manufacture of the semiconductor device shown in FIGS. 1–4 in which a semiconductor device in accordance with the present invention is formed. In the figures, there has not been an attempt to show any of the features to an exact scale. In addition, the vertical dimension is somewhat larger so that the junctions and film thicknesses are actually smaller than they appear in the figures in relation to the horizontal dimension of the various elements.

Figure 1:
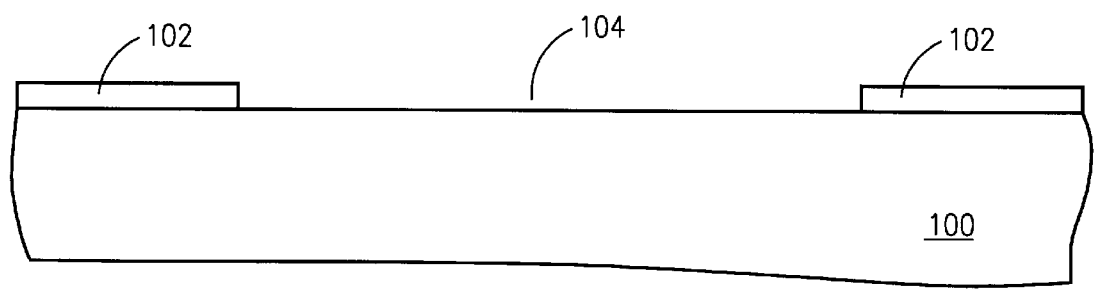
FIGS. 1–4 show selected initial steps in the manufacture of a semiconductor device.

FIG. 1 shows a lightly p-type doped silicon substrate 100 with an oxide layer 102 that has been formed on the surface of the substrate 100 and etched to expose a portion of the surface 104 of the substrate 100. The oxide layer 102 is typically formed by exposing the surface of the substrate 100 to a wet oxidation atmosphere and a high temperature cycle. The substrate doping is selected to be light enough to minimize the parasitic collector-to-substrate depletion-layer capacitance, but heavy enough to prevent it from being changed to n-type during subsequent processing.

Figure 2:
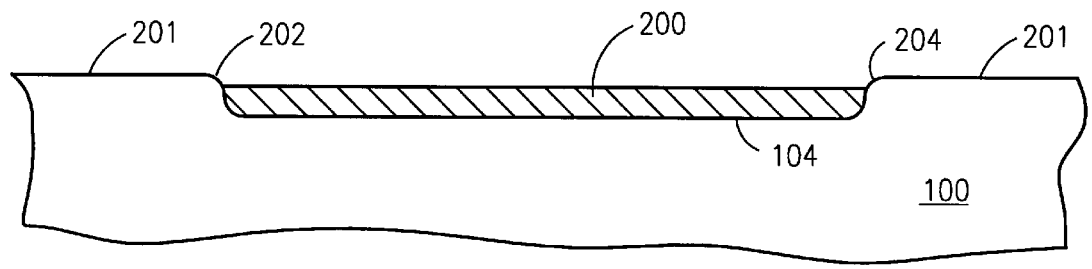

FIG. 2 shows the portion of the substrate 100 shown in FIG. 1 with a layer 200 formed in the portion of the surface 104 defined by the oxide layer 102 shown in FIG. 1 in which a window has been etched. The layer 200 is formed by heavy n+ type diffusion or ion implantation and will become a buried layer during further processing. The buried layer is also called a subcollector. The surface 104 of the substrate 100 is exposed to an appropriate atmosphere containing the selected dopant ions or an ion implantation at approximately 30 keV and approximately $10^{15}$ atoms/cm$^2$ is done. In order to minimize the further diffusion of the layer 200 during subsequent processes that are conducted at high temperature, dopants with relatively small diffusion constants such as arsenic and antimony are used to form the layer 200. The highly doped layer 200 provides a low resistance path from the active part of the transistor, to be discussed later, to the collector contact, which will also be discussed later. The oxide layer 102 is removed exposing the surface 201 of the substrate 100. An anneal/drive-in procedure is performed in an oxidizing ambient that causes a new oxide to be formed on the wafer surface. After the diffusion to form the layer 200 is completed, a step of approximately 100–200 nm remains in the substrate 100 at the edges of the layer 200. The step is indicated at 202 and 204 and is formed because of the unequal thicknesses of the oxides that have grown on the respective underlying materials. The step propagates through the epitaxial layer and becomes the alignment mark that allows subsequent mask levels to be aligned with the buried layer.

Figure 3:
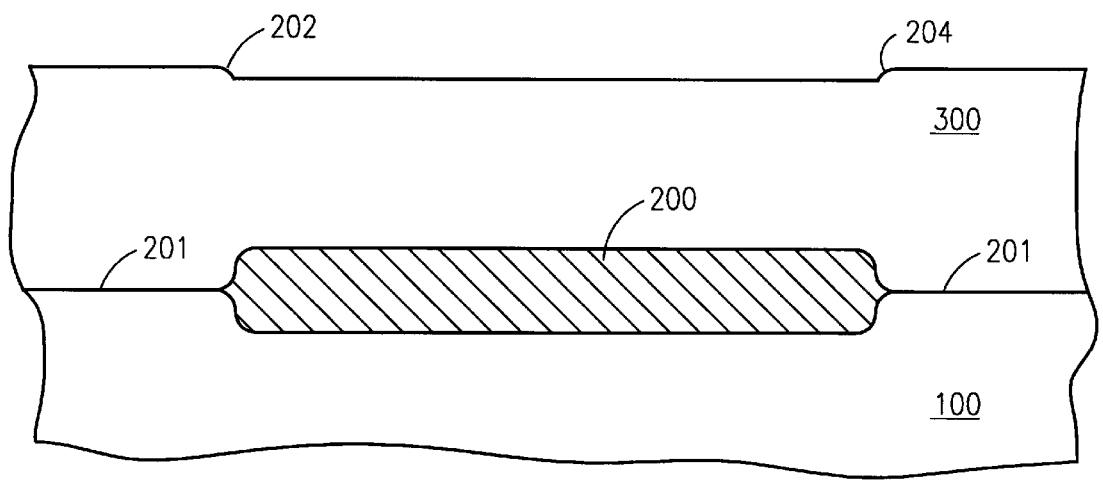

FIG. 3 shows an epitaxial layer 300 grown on the surface of the entire wafer, including the surface 201 of the substrate 100 and the surface of the layer 200. The epitaxial layer 300 is a lightly doped n-type layer and under proper conditions the epitaxial layer 300 is a single-crystal layer that continues the crystal structure of the original substrate. This makes the epitaxial layer 300 suitable for the fabrication of devices. The dopant typically used to form the lightly doped (approximately $10^{15}$–$10^{16}$ atoms/cm$^3$) n-type epitaxial layer is arsenic because of its small diffusivity. The minimum thickness and maximum doping concentration of the epitaxial layer are determined by the avalanche breakdown and reach-through limitations on the value of $BV_{CE0}$. During the growth of the epitaxial layer the step indicated at 202, 204 is shown replicated on the surface of the epitaxial layer 300. The presence of the step allows subsequent mask levels to be aligned to the layer 200, which is now buried. During the growth of the epitaxial layer 300, which is done at a high temperature, the buried layer 200 becomes larger because of diffusion of the dopants used to form the buried layer 200. As discussed above, dopants with a low diffusion rate are typically used to minimize the subsequent growth of the buried layer 200.

Figure 4:
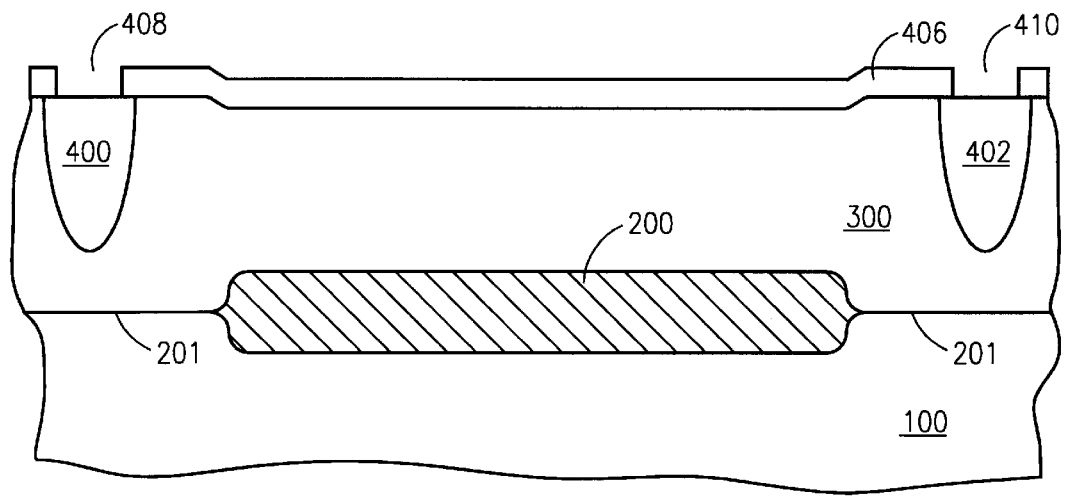
Figure 5:
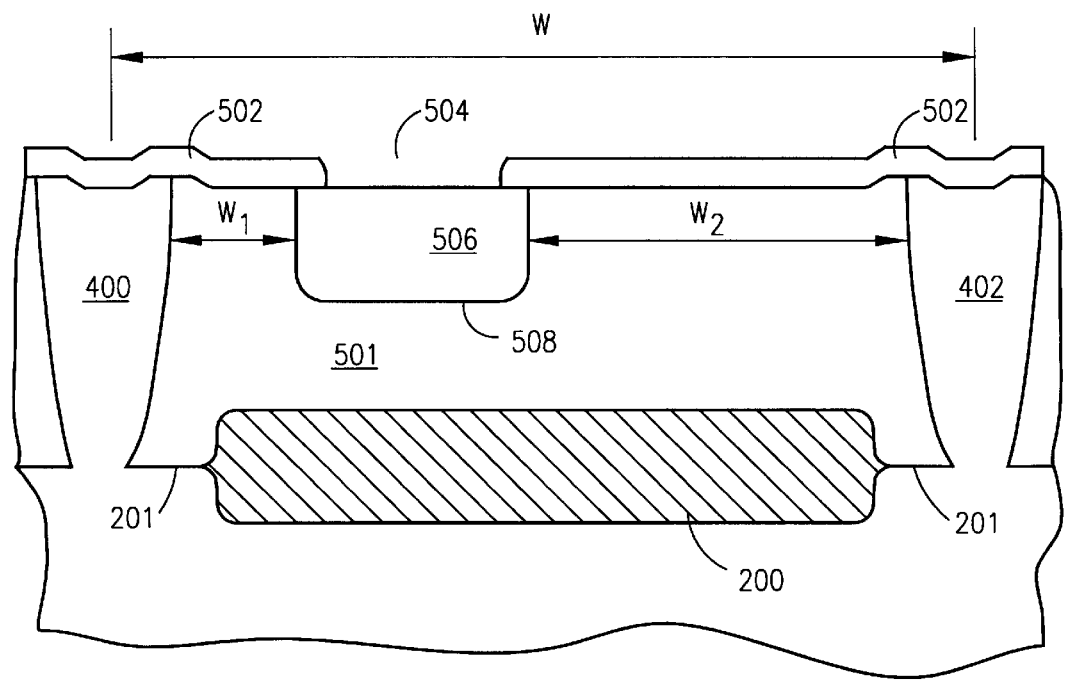
FIGS. 5–8 show selected continuing steps in the manufacture of the semiconductor device shown in FIGS. 1–4 to obtain a prior art semiconductor device.

FIG. 4 shows two isolation structures 400 and 402 formed in the epitaxial layer 300. The isolation structures are formed by growing an oxide layer 406 on the surface of the epitaxial layer 300 and opening windows, indicated at 408 and 410, in the oxide layer 406 at locations where isolation structures are to be formed. A deep p+ type diffusion process, typically using boron, is then performed. The purpose of the isolation structures is to isolate the collectors of the transistors from one another with reverse-biased pn junctions. Thus, the acceptor concentration in the isolation regions must be higher than the donor concentration in the epitaxial layer, and the junction depth (the depth of the isolation structures) must be at least equal to the depth of the epitaxial layer in order for complete isolation to be achieved. As shown in FIG. 4, p+ isolation structures 400 and 402 are formed. Initially, the p+ isolation structures 400 and 402 do not extend to the substrate layer 100. However, subsequent high-temperature processes will cause the p+ isolation diffusion making up the isolation structures 400 and 402 to reach as far as the original substrate surface 201 as shown in FIG. 5. It is customary to "overdrive" the isolation diffusion beyond the depth of the epitaxial layer to prevent the possibility that the depletion region could extend beneath the isolation diffusion. Once the p+ isolation diffusion reaches or extends beyond the original substrate layer, there will be an n-type island completely surrounded by p+ type material. This can be clearly seen in FIG. 5. It should be appreciated by one of ordinary skill in the art, that the figures show a cross-section of the device and the structures are three-dimensional. For example, it should be appreciated that the isolation structures indicated at 400 and 402 surround the region 500 of the device shown in FIG. 5.

Figure 6:
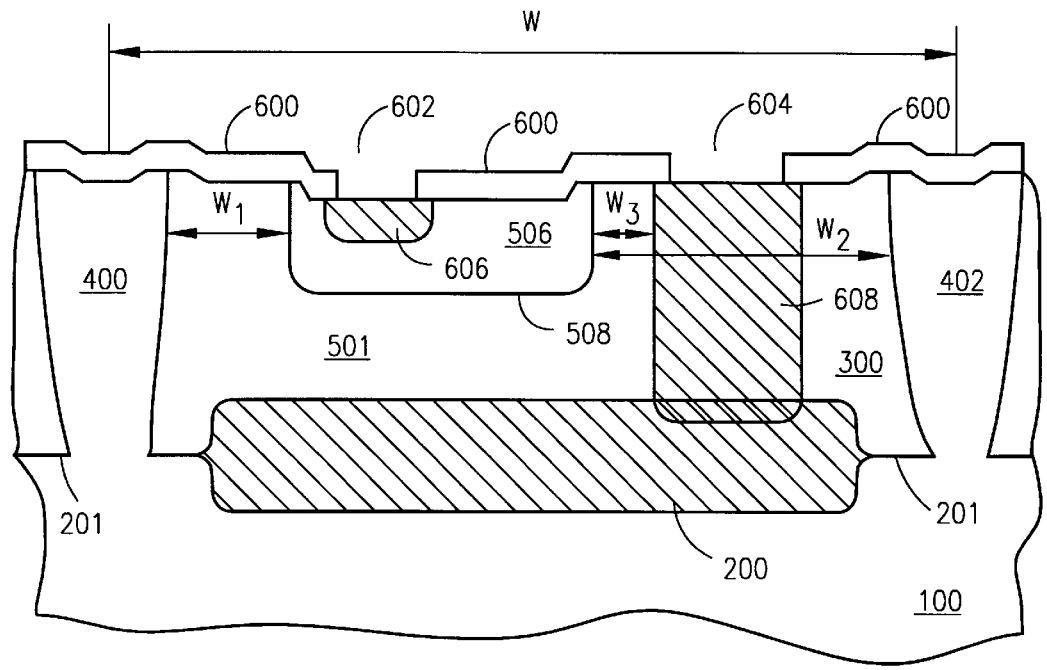

FIG. 5 shows the device shown in FIG. 4 with the oxide layer 406 removed and a new oxide layer 502 formed on the device. A base diffusion mask is used to open a window 504 in the oxide and a p-type diffusion process is performed to form the base region 506 of the transistor. The formation of the base region is one of the most critical processes in bipolar transistor fabrication. The base must be aligned so that the collector-base and collector-substrate depletion regions do not merge, following diffusion at the surface. The minimum allowable spacing between the isolation regions and the base region is determinable from knowledge of the applied voltages and the epitaxial-layer doping concentration. The width W is shown from the center of the isolation regions 400 and 402 and represents the minimum size of the device. The minimum distances the boundaries of the base region must be from the isolation regions 400 and 402 are represented by $w_1$ and $w_2$, respectively. These distances are determined from knowledge of the operating voltage of the device and the doping concentrations of the epitaxial region, the base region and the collector region. Another distance that must be considered is the distance between the boundary of the base and the collector region. This distance is shown in FIG. 6 and will be discussed in relation to FIG. 6. The collector-base junction 508 does not reach as far as the buried layer 200. As a result the region 501 between the base region 506 and the buried layer 200 remains lightly doped, which gives more ideal characteristics for the transistor including a high breakdown voltage.

FIG. 6 shows the device shown in FIG. 5 with an oxide layer 600 formed on the surface of the device. In one type of prior art device, a window at 602 is opened in the oxide layer 600 for an emitter diffusion process and a window at 604 is opened at the same time in the oxide layer 600 for a collector diffusion process. In such a device, the combined emitter and collector diffusion process is a shallow, high-concentration n-type diffusion and is performed in an oxidizing ambient so that an oxide layer covers the entire wafer after the diffusion is completed. In another type of device, the emitter diffusion and collector diffusion process shown in FIG. 6 are done in separate diffusion processes. If the collector region 608 is to extend to the buried layer 200, it may be necessary to have the emitter diffusion process separate from the emitter diffusion process so that the emitter diffusion does not diffuse too deeply into the base region 506. The deep diffusion of the collector region (also called a plug or sinker) is necessary in some applications because the value of the $R_C$ (the resistance of the collector to base path) is too high. In junction-isolated SBC devices, the collector contact is typically formed by means of a diffusion process. In other types of devices, an ion implantation process could be used. Phosphorus is chosen for this application since it is a faster-diffusing impurity than arsenic. As can be appreciated, an additional mask must be used to allow the dopant to be selectively introduced only into the collector region. The emitter diffusion process forms the emitter region 606 and the collector diffusion process forms the collector region 608. The minimum distance that must be maintained between the boundary of the base region 506 and the collector region 608 is $w_3$. Similarly to the selection of the distances $w_1$ and $w_2$ discussed above in relation to FIG. 5, this distance is selected from knowledge of the operating voltage of the device, the relative concentrations of the surrounding regions and the desired operating frequency of the device. As can be appreciated, once the operating voltage and desired operating frequency of the device is determined, the relative doping concentrations can be selected to provide the necessary breakdown voltage and desired operating frequency. With these factors determined, the minimum widths of $w_1$, $w_2$, and $w_3$ are determined.

Figure 7:
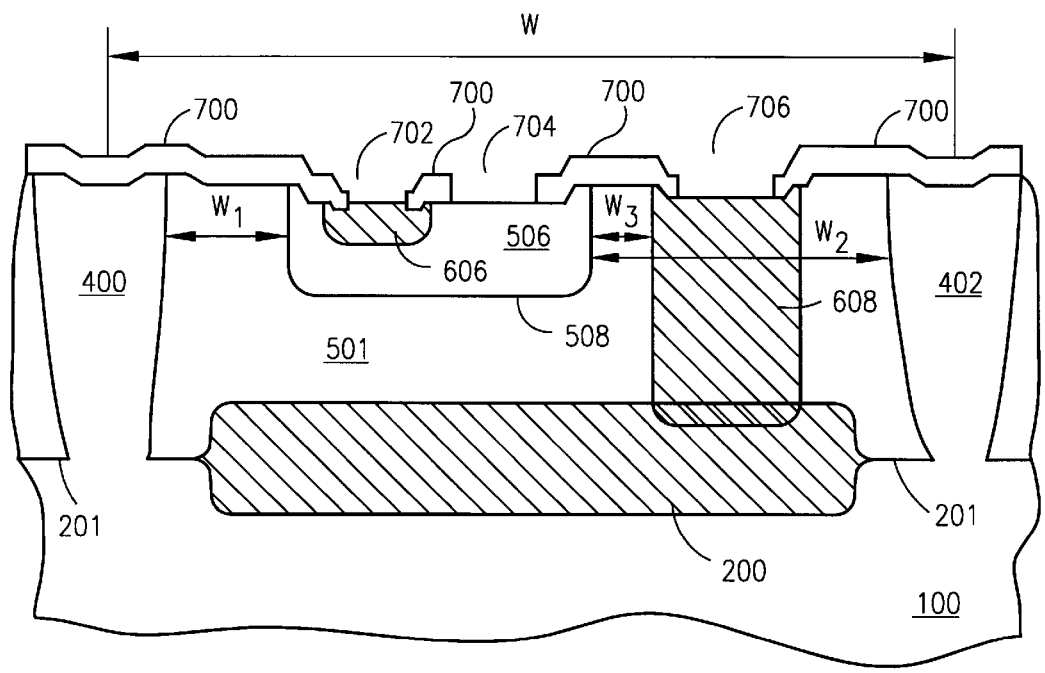

FIG. 7 shows the device shown in FIG. 6, after the contact mask has been used to open windows in the oxide layer 600. There is a window 700 to the emitter region 606, a window 702 to the base region 506, and a window 704 to the collector region 608. The windows 700, 702, and 704 are for the purpose of allowing electrical contacts to be made to the emitter region, the base region and the collector region.

Figure 8:
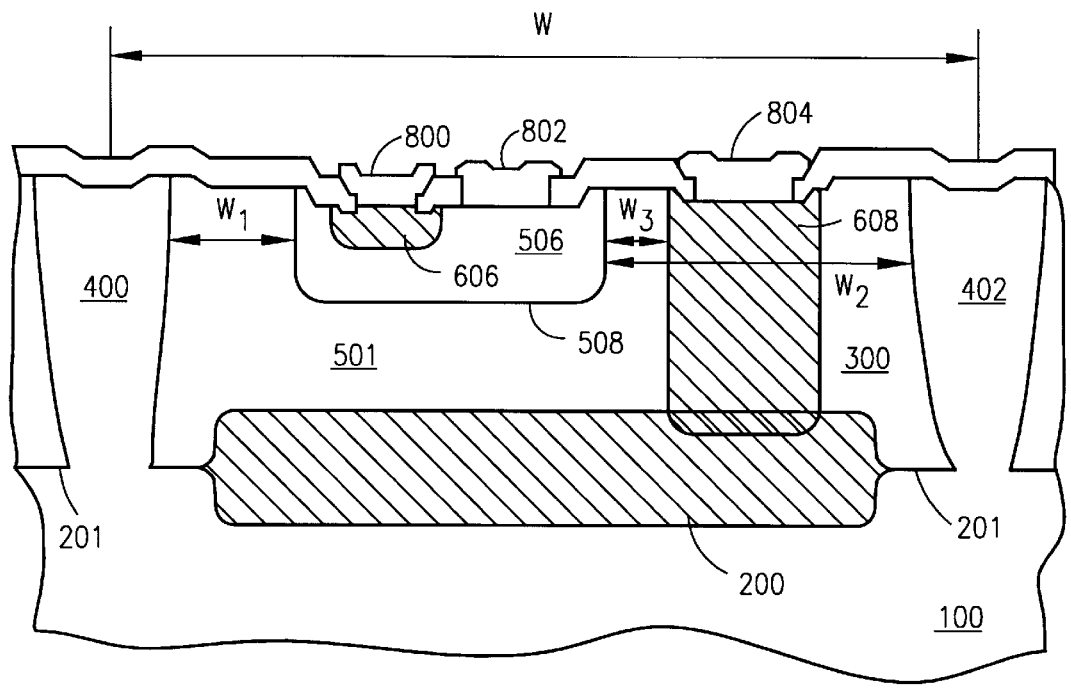

FIG. 8 shows the device shown in FIG. 7, with an electrical contact 800 to the emitter region 606, an electrical contact 802 to the base region 506, and an electrical contact 804 to the collector region 608.

Figure 9:
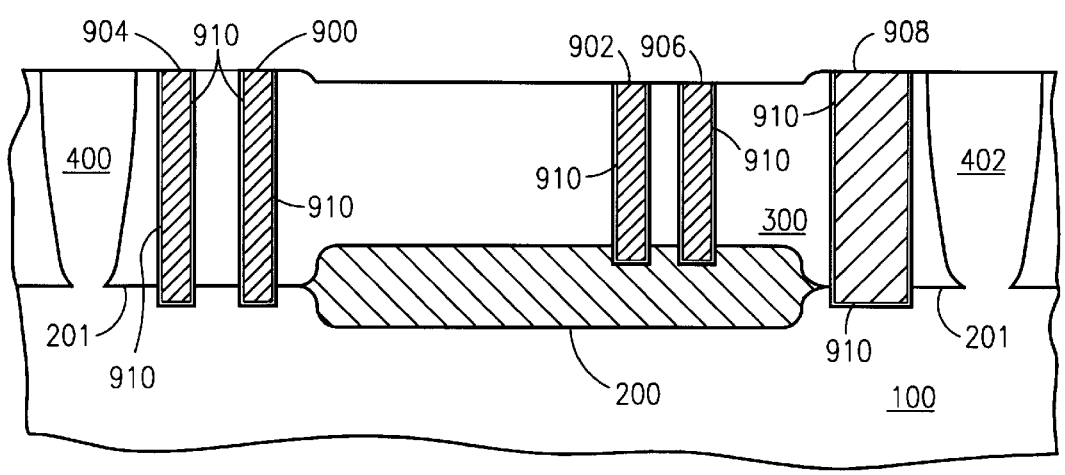
FIGS. 9–13 show selected continuing steps in the manufacture of the semiconductor device shown in FIGS. 1–4 to obtain a semiconductor device in accordance with the present invention.
Figure 14:
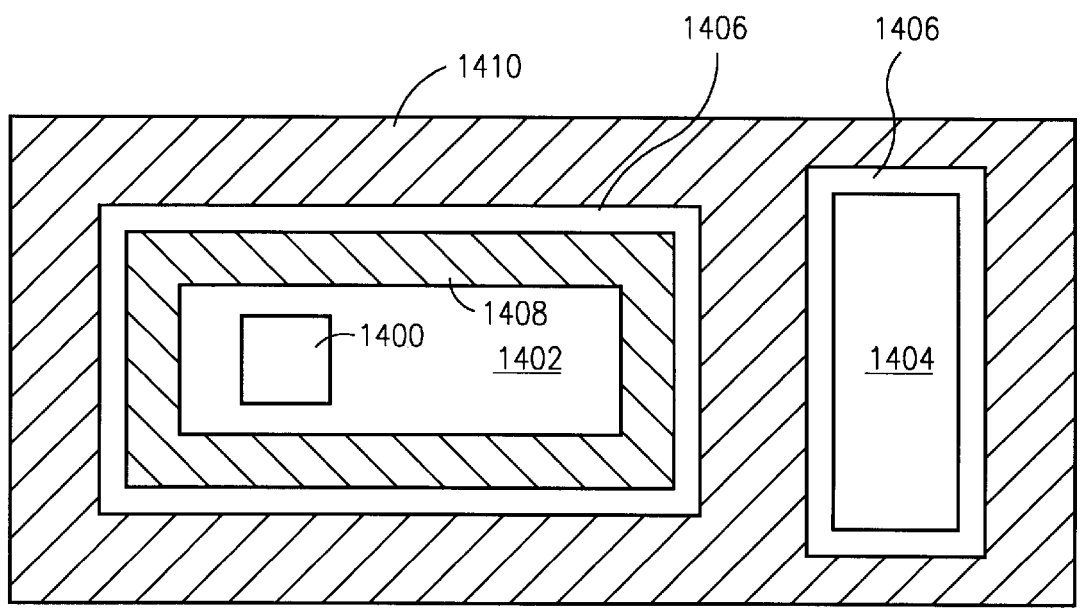
FIG. 14 is a plan view of a semiconductor device manufactured in accordance with the present invention.

FIG. 9 shows the device shown in FIG. 4 with a first slot formed in the device with a first portion of the first slot indicated at 900 and a second portion of the first slot indicated at 902. It should be appreciated that the first slot is a continuous slot and the portions 900 and 902 are portions of the first slot. A second slot is formed in the device with a first portion indicated at 904 and a second portion indicated at 906. The continuity of the slots is shown in FIG. 14. The depths of the first and second slots are selected so that the portions of the first and second slots that are not over the buried layer 200, such as 900 and 904, will extend just beyond the interface 201 between the substrate 100 and the epitaxial layer 300. The depths of the first and second slots are selected so that the portions of the first and second slots that are over the buried layer will extend just beyond the surface of the buried layer 200. A third slot 908 is formed in the device and has a depth selected to extend just beyond the interface 201 between the substrate 100 and the epitaxial layer 300. One method of forming the slots is to provide a protection layer consisting of a layer of thermal oxide, a deposited layer of silicon nitride, and a deposited layer of oxide. A layer of photoresist is deposited and a photoresist mask patterns the photoresist and a reactive ion etch (RIE) with chemistry etches through the protection layer, the oxide and nitride to the photoresist. The photoresist is removed and reactive ion etching with chemistry is used to etch the silicon slot. A liner material 910 is formed on the walls of the slot. The liner material depends upon the slot material and could be thermal oxide or silicon nitride. The slots are filled with a material such as polysilicon or tungsten. The slot material is planarized using a chemical mechanical planarization process. Any well-known method of making slots in a silicon device can be used to form the slots.

Figure 10:
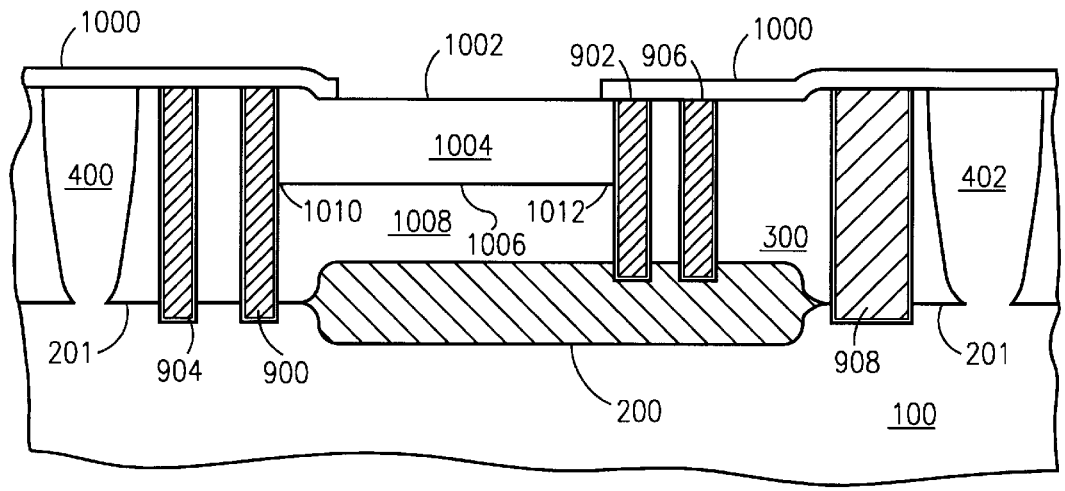

FIG. 10 shows the device shown in FIG. 9 with an oxide layer 1000 formed on the device. A base diffusion mask is used to open a window 1002 in the oxide layer 1000 and a p-type diffusion process is performed to form the base region 1004 of the transistor. The p-type diffusion process to form the base region 1004 is controlled to ensure that the base region boundary 1006 (which becomes the collector-base junction) does not reach as far as the buried layer 200. As a result, the region 1008 between the base region 1004 and the buried layer 200 remains lightly doped, which provides a device with more ideal characteristics for the transistor and also provides a higher breakdown voltage. The base diffusion process performed within the slot portion 900 and 902 provides a collector-base junction 1006 that is substantially planar; that is, with substantially no spherical or cylindrical curvature such as in prior art devices. The collector-base junction 1006 terminates substantially perpendicular to the slot portion 900 and the slot 902. The perpendicular termination is indicated at 1010 and 1012.

Figure 11:
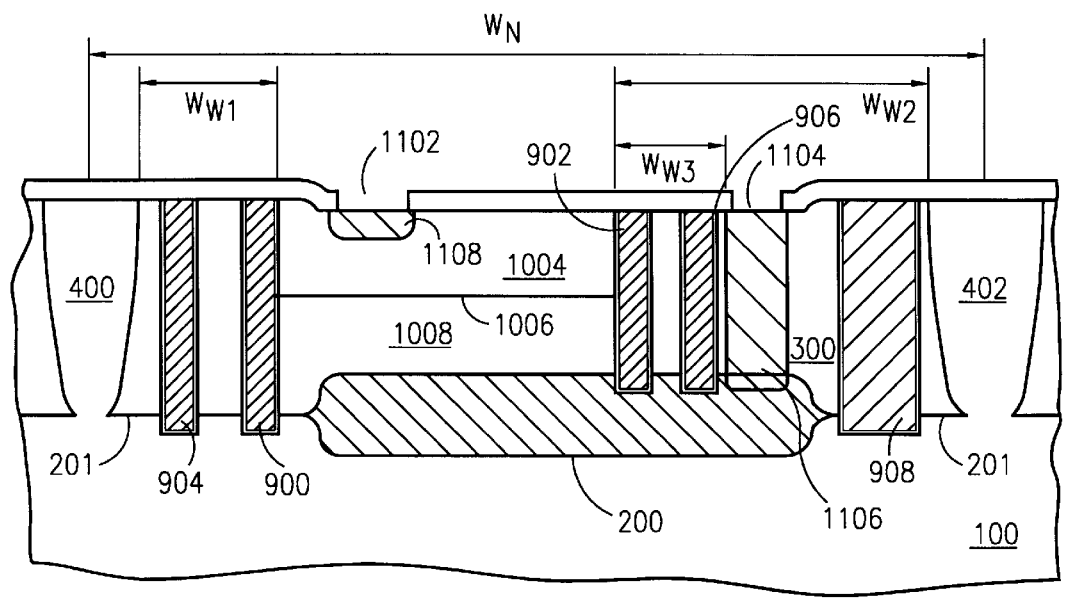

FIG. 11 shows the device shown in FIG. 10 with the oxide layer 1000 removed and a new oxide layer 1100 formed on the surface of the device. In one type of device, a window at 1102 is opened in the oxide layer 1100 for an emitter diffusion process and a window at 1104 is opened at the same time in the oxide layer 1100 for a collector diffusion process. In such a device, the combined emitter and collector diffusion process is a shallow, high-concentration n-type diffusion and is performed in an oxidizing ambient atmosphere so that an oxide layer covers the entire wafer after the diffusion is completed. In another type of device, the emitter diffusion and the collector diffusion process are done in separate diffusion processes. If the collector region 1106 is to extend to the buried layer 200 it may be necessary to have the emitter diffusion process done separately from the emitter diffusion process so that the emitter diffusion does not diffuse too deeply into the base region 1004. The deep diffusion of the collector region 1106 is necessary in some applications because the value of the $R_C$ (the resistance of the collector-to-base path) is too high if a deep diffusion is not done. The deep diffusion of the collector region is also called a plug or sinker. In junction-isolated SBC devices, the collector contact is typically formed by means of a diffusion process. In other types of devices, an ion implantation process could be used. Phosphorus is chosen for this application since it is a faster-diffusing impurity than arsenic. As can be appreciated, an additional mask must be used to allow the dopant to be selectively introduced only into the collector region. The emitter diffusion process forms the emitter region 1108 and the collector diffusion process forms the collector region 1106. FIG. 11 shows the critical distances $W_N$, $w_{N1}$, $w_{N2}$, and $w_{N3}$ that correlate to the distances W, $w_1$, $w_2$, and $w_3$, respectively, of a prior art device shown in FIG. 5. The slots with portions shown at 900, 902, 904, and 906: either (1) allow the device to be used at a higher operating voltage because the breakdown voltage is higher or (2) allow the device to be shrunk, that is, $W_N$ to be less than W for the same operating voltage since the breakdown voltage remains the same as the device is shrunk.

Figure 12:
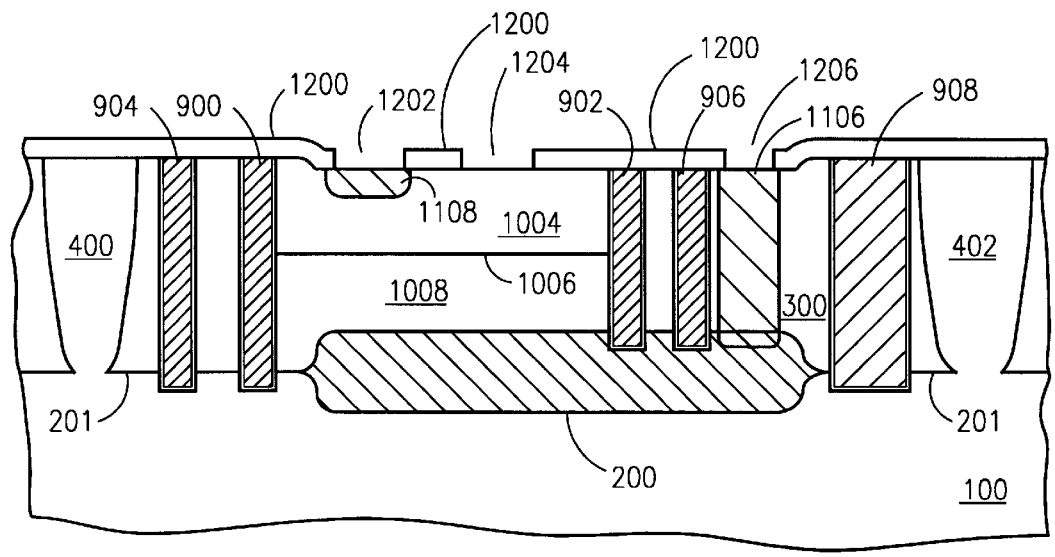

FIG. 12 shows the device shown in FIG. 11, after the oxide layer 1100 has been removed and a new oxide layer 1200 formed on the surface of the device. FIG. 12 shows the new oxide layer 1200 after a contact mask has been used to open windows in the oxide layer 1200. There is a window 1202 to the emitter region 1108, a window 1204 to the base region 1004, and a window 1206 to the collector region 1106.

Figure 13:
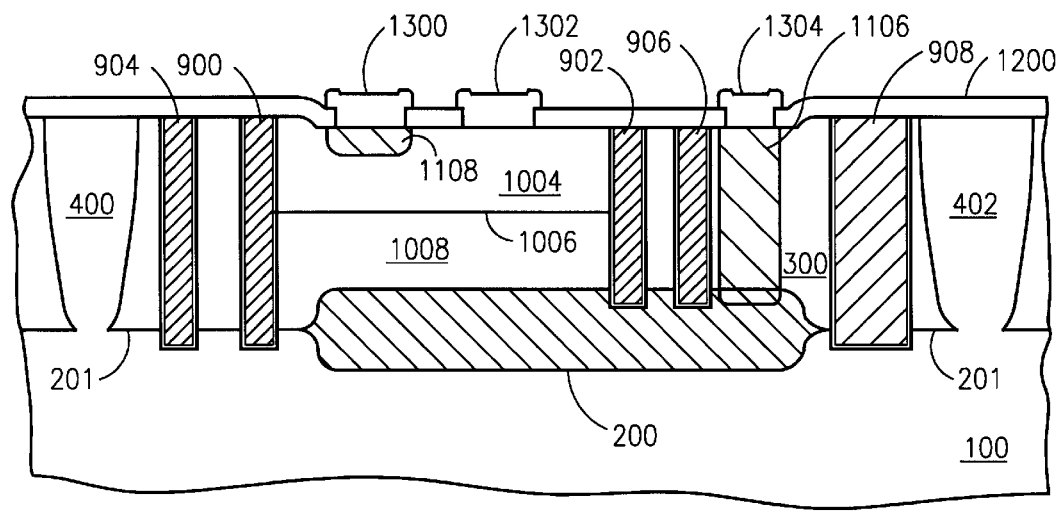

FIG. 13 shows the device shown in FIG. 12 with an electrical contact 1300 to the emitter region 1108, an electrical contact 1302 to the base region 1004, and an electrical contact 1304 to the collector region 1106.

FIG. 14 is a plan view of a portion of a semiconductor device fabricated in accordance with the present invention. An emitter region 1400 is shown in a base region 1402. A collector region 1404 is shown in a portion of the epitaxial region 1406. The base region 1402 is surrounded by a first slot 1408. The base region 1402 is surrounded by at least a second slot 1410. The slot 1410 also has a portion that surrounds the collector region 1404.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A semiconductor device having a base region surrounded by at least two slots wherein a portion of the at least two slots separate the base region from a collector region of the semiconductor device.

2. The semiconductor device of claim 1, wherein the base region and the surrounding slots are formed in an epitaxial region.

3. The semiconductor device of claim 2, wherein the epitaxial region is grown on a substrate region.

4. The semiconductor device of claim 3, further comprising a buried layer region formed on a portion of an interface between the substrate region and the epitaxial region.

5. The semiconductor device of claim 4, further comprising a collector region formed in the epitaxial region.

6. The semiconductor device of claim 5, wherein at least one of the slots surrounding the base region has a portion that surrounds the collector region.

7. The semiconductor device of claim 6, wherein the collector region extends through the epitaxial region and merges with the buried layer region.

8. The semiconductor device of claim 7, wherein a first portion of each of the at least two slots extends through the epitaxial region and extends into the substrate region and a second portion of each of the at least two slots extends through the epitaxial region and extends into a surface of the buried layer region.

9. The semiconductor device of claim 8, wherein the base region terminates on one of the at least two slots.

10. The semiconductor device of claim 9, wherein the base region terminates substantially perpendicularly with a surface of one of the at least two slots.

11. The semiconductor device of claim 10, wherein the slots are filled with a material selected from the group consisting of polysilicon and tungsten.

* * * * *